United States Patent
Fuh

(10) Patent No.: US 7,685,480 B1
(45) Date of Patent: Mar. 23, 2010

(54) CONTENT ADDRESSABLE MEMORY HAVING REDUNDANT ROW ISOLATED NOISE CIRCUIT AND METHOD OF USE

(75) Inventor: Horng-jyi Fuh, San Jose, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 318 days.

(21) Appl. No.: 11/764,668

(22) Filed: Jun. 18, 2007

(51) Int. Cl.
G11C 29/26 (2006.01)
G11C 29/50 (2006.01)

(52) U.S. Cl. ................ 714/719; 714/718; 714/724

(58) Field of Classification Search .............. None
See application file for complete search history.

(56) References Cited

U.S. PATENT DOCUMENTS

| | | | |
|---|---|---|---|
| 6,275,406 B1 * | 8/2001 | Gibson et al. ............ 365/49.17 |
| 6,275,426 B1 | 8/2001 | Srinivasan et al. | |
| 6,324,087 B1 | 11/2001 | Pereira | |
| 6,469,541 B2 | 10/2002 | Tran et al. .................. 326/52 |
| 6,687,785 B1 | 2/2004 | Pereira | |
| 6,714,430 B1 | 3/2004 | Srinivasan et al. | |
| 6,763,425 B1 | 7/2004 | Pereira | |
| 6,804,135 B1 | 10/2004 | Srinivasan et al. | |
| 6,865,098 B1 | 3/2005 | Ichiriu et al. | |
| 6,920,525 B2 * | 7/2005 | Chadwick et al. ........... 711/108 |
| 7,016,243 B1 | 3/2006 | Srinivasan et al. | |
| 7,219,187 B1 * | 5/2007 | Khanna et al. ............. 711/108 |
| 7,219,188 B1 | 5/2007 | Pereira | |
| 7,251,707 B1 | 7/2007 | Pereira | |
| 7,325,091 B2 | 1/2008 | Pereira | |
| 2002/0003743 A1 * | 1/2002 | Kunikiyo ............... 365/230.05 |
| 2003/0023804 A1 * | 1/2003 | Matsuda et al. ............ 710/313 |
| 2004/0056280 A1 * | 3/2004 | Murata et al. .............. 257/208 |

OTHER PUBLICATIONS

Neil Weste & Kamran Eshraghian, Principles of CMOS VLSI Design, A Systems Perspective, 2d ed.1992, pp. 304-305.

* cited by examiner

Primary Examiner—Kevin L Ellis
Assistant Examiner—Dipakkumar Gandhi
(74) Attorney, Agent, or Firm—Mahamedi Paradice Kreisman LLP; William L. Paradice, III

(57) ABSTRACT

A system and method are provided for reducing the capacitive coupling noise on a fuse line of a content addressable memory (CAM) system. The CAM system includes a plurality of CAM arrays having a plurality of rows of CAM cells to store data coupled to wordlines, searchlines, bitlines and matchlines for reading from, writing to, and searching data in the CAM cells and a hit circuit coupled to the matchlines of each of the plurality of CAM arrays, the hit circuit to compare the data stored in the CAM cells against data presented on the wordlines of the CAM array.

20 Claims, 6 Drawing Sheets

(a)

(b)

(c)

CONTENT ADDRESSABLE MEMORY HAVING REDUNDANT ROW ISOLATED NOISE CIRCUIT AND METHOD OF USE

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g. search words) to the array and then performing a compare operation to identify one or more locations within the array that contain data equivalent to the applied data and thereby represent a "match" condition. In this manner, data is accessed according to its content rather than its address. Upon completion of the compare operation, the identified location (s) containing equivalent data is typically encoded to provide an address at which the equivalent data is located. If multiple locations are identified is response to the compare operation, then priority encoding operations may be performed to identify a best or highest priority match. Such priority encoding operations frequently utilize the physical locations of multiple matches within the CAM array to identify a highest priority match.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals {1011}, the following entries will result in a match condition in a CAM comprising ternary CAM cells: {1011}, {X011}, {1X11}, {10X1}, {101X), {XX11}, {1XX1}, . . . , {1XXX}, {XXXX}.

CAMs are based on memory cells that have been modified by the addition of extra transistors to perform the comparison function. For writing and reading, each static CAM cell performs like a traditional SRAM cell, with differential bit lines to latch the desired value into the cell when writing, and sense amps to detect the stored value when reading. When writing, the appropriate word line of the CAM is selected, turning on the pass transistors that then force the cross-coupled transistors to the levels of the bit lines. When the word line is deselected, the cross-coupled transistors remain in the same state, thereby storing the desired value. For reading, the desired bit lines of the CAM are pre-charged to an intermediate voltage level and the desired word lines are selected. The bits lines are then forced to the levels stored by the cross-coupled transistors. A set of sense amps respond to the difference in the bit lines and output the stored value. For comparing, the matchline of the CAM is pre-charged to a high level, the bit lines are driven by the levels of the bits stored in a comparand register coupled to the CAM, but the word lines are not selected, so that the state of the cross-coupled transistors is not affected. The exclusive-NOR transistors then compare the internally stored bit of the cross-coupled transistors against the comparand bit, and if they do not agree, the matchline is pulled down, indicating a non-matching bit. All the bits in a stored entry are connected to the same matchline, so that if any bit in a word does not match with its corresponding comparand bit, that matchline is pulled down. A pulled down matchline therefore indicates a "miss" condition. Only the entries where the matchline stays HIGH are considered matches, indicating a "hit" condition.

The increasing size, density and complexity of CAMs make it extremely difficult to fabricate a CAM that is entirely free of defects. CAM defects can be reduced by improved fabrication methods and increased process controls, but there are practical limitations to implementing such methodologies. In the alternative, the yield of a CAM can be increased by circuit designs that can compensate for manufacturing defects. One such approach is the use of redundancy schemes. Both row and column redundancy schemes are well known in the art, and typically involve manufacturing a number of redundant memory cells in addition to the standard memory cells. The CAM is tested after fabrication and if defective standard cells are identified, they are replaced by the redundant cells.

Implementing redundancy schemes requires that the identified defective cells be disabled and then the replacement cells enabled. Conventional circuitry to enable replacement of a defective row with a redundant row in a CAM array involves fuse-programmable circuitry. Each row of a CAM array is typically connected to a word line and at least one matchline. Thus, to implement traditional row redundancy techniques in a CAM array it is necessary to shift the defective memory to a redundant row and also to turn off the associated hit circuit associated with the defective memory. A word line and the corresponding hit circuit are disabled when the fuse is blown in response to yield testing. The fuse line is associated with both the word line and the matchline.

Typically, the fuse lines for a CAM array are relatively long and susceptible to noise from adjacent lines in the array. If a sufficient level of noise is incident upon the matchline of a CAM array, the noise may propagate through the fuse line causing a previously disabled matchline to become enabled, thereby resulting in a possible hit error at the output of the CAM array.

It is known in the art to use a transmission gate or a pass gate on the fuse line to disable the hit circuit of a CAM array. The transmission gate provides XNOR logic along the fuse line. In such an embodiment, the transmission gate or pass gate is coupled along the fuse line and enabled, such that the input to the gate is passed to the output of the gate. As such, when a defective memory is identified, the fuse on the fuse line is blown to disable the word line and the transmission gate passes the result of the blown fuse to disable the corresponding hit circuit. However, transmission gates are nonrestoring gates, such that the noise at the input is coupled to the output. As such, if noise is incident upon the fuse line, that noise will be passed through the transmission gate. If the noise is sufficiently large, it may be sufficient to turn on the word line that was previously disabled and as such enable the corresponding hit circuit resulting in a hit error. Essentially, the pass gate in this configuration is equivalent to a resistor which allows noise to falsely turn on the word line. This situation is undesirable as it results in a defective CAM array.

In light of the above, a need exists in the art for an improved system and method for reducing the noise on a fuse line that is incident upon a hit circuit of a CAM array.

SUMMARY OF THE INVENTION

In accordance with the present invention, a system and method are provided for reducing the capacitive coupling noise on a fuse line of a content addressable memory (CAM) system.

In a particular embodiment, the CAM system in accordance with the present invention includes a plurality of CAM arrays having a plurality of rows of CAM cells to store data coupled to wordlines, searchlines, bitlines and matchlines for reading from, writing to, and searching data in the CAM cells. A fuse circuit is provided to identify a CAM array as being a defective CAM array or a non-defective CAM array. The defective CAM arrays may be identified during the testing of the device. As such, a shift circuit is coupled to the each of the plurality of CAM arrays to allow the wordlines and the matchlines of an identified defective CAM array to be bypassed so as not to effect the operation of the CAM system. The system further includes a hit circuit coupled to the matchlines of each of the plurality of CAM arrays. The hit circuit is used to compare the data stored in the CAM cells against data presented on the wordlines of the CAM array. When a CAM array has been identified as being defective, in addition to shifting the wordlines and matchlines associated with the defective array, it is also necessary to turn off the hit circuit for the defective array. It is known in the art that noise on the matchline of the array may be substantial enough to inadvertently enable a hit circuit that has been previously disabled. As such, in accordance with the present invention a hit off circuit is provided that is coupled to the hit circuit that is effective in turning off the hit circuit. Additionally, the hit off circuit of the present invention includes an XNOR circuit utilizing tristate inverters to reduce the capacitive coupling noise at the output of the XNOR circuit thereby preventing the hit circuit from being accidentally enabled.

In a specific embodiment, the shift circuit further includes at least one redundant CAM array, a wordline shift circuit coupled between the fuse circuit and each of the plurality of CAM arrays and to the at least one redundant CAM array, the wordline shift circuit to shift the wordlines of a defective CAM array to a non-defective CAM array or to the at least one redundant CAM array and a matchline shift circuit coupled to each of the plurality of CAM arrays, to the at least one redundant CAM array and to the wordline shift circuit, the matchline shift circuit to shift the matchlines of a defective CAM array to a non-defective CAM array or to the at least one redundant CAM array.

In particular embodiment, the wordline shift circuit utilizes a 1-to-2 decoder coupled between the fuse circuit and each of the plurality of CAM arrays and the matchline shift circuit utilizes a 2-to-1 multiplexer coupled to each of the plurality of CAM arrays.

As such, the hit off circuit utilizing an XNOR tristate inverter circuit in accordance with the present invention represents an improvement over the buffered transmission gate as is currently known in the art. The area required by the tristate inverter is marginally lower, and since no current flows in the channels of the tristate inverter, a change in state of the input no longer produces a current spike. Additionally, the tristate inverter is an active gate and can provide amplification that can be used to drive additional circuitry within the system. In the tristate inverter in accordance with the present invention, the output is actively driven from Vdd or GND, so it is a restoring logic gate. The tristate inverter does not follow the conduction complement rule because it must allow the output to float under certain input conditions. When EN is '0', both enable transistors are OFF leaving the output floating. When EN is '1', both enable transistors are ON. They are conceptually removed from the circuit, leaving a simple inverter.

As such, the present invention provides an improved CAM array having redundancy circuitry which prevents noise on a fuse line from being propagated through the array and falsely enabling a hit circuit that has been previously disabled as the result of a defective CAM cell.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
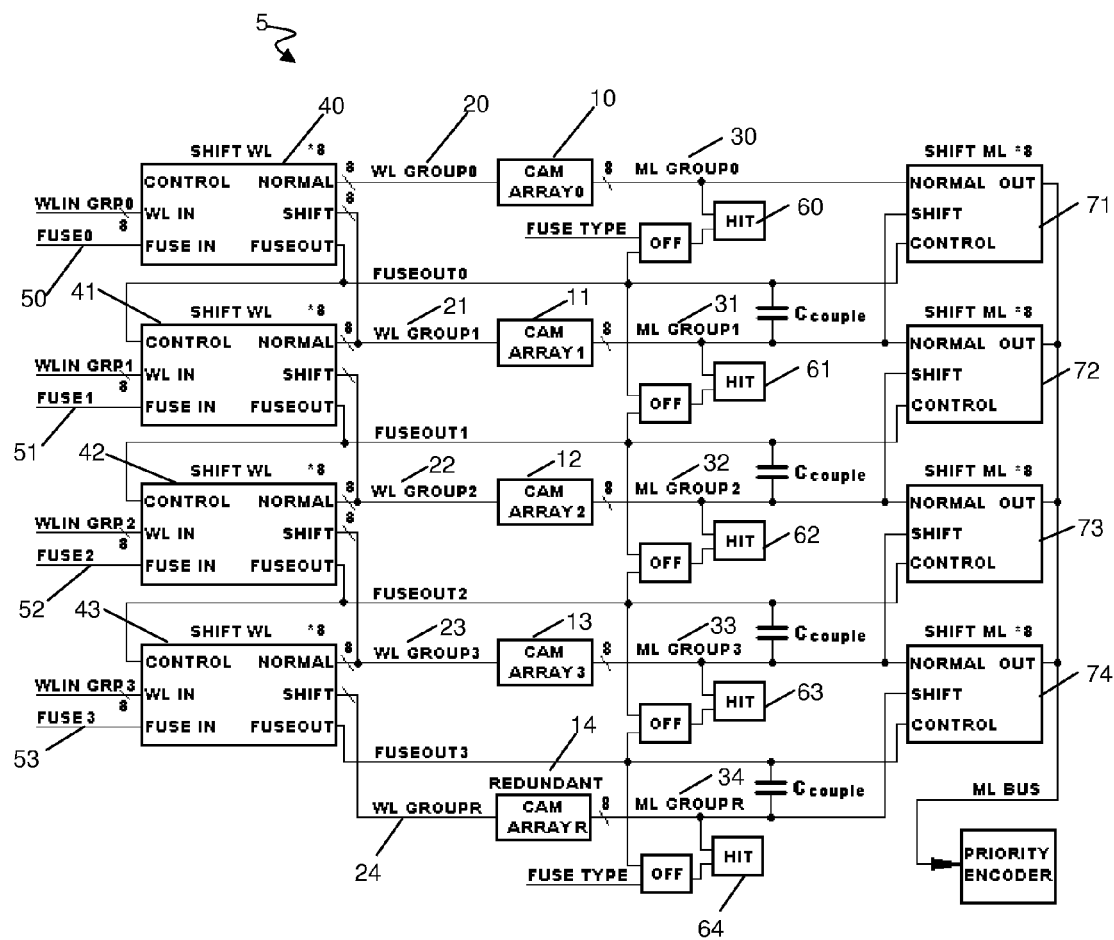
FIG. 1 is a schematic illustration of a content addressable memory array in accordance with the present invention having redundant replacement of groups of rows within the array.

With reference to FIG. 1, a CAM system 5 is illustrated having a plurality of CAM arrays 10-14, including at least one redundant CAM array 14. Each of the CAM arrays 10-14 includes a plurality of rows of CAM cells. The CAM cells of the CAM arrays 10-14 are coupled to wordlines 20-24 and matchlines 30-34 for reading from, writing to, and searching data in the CAM cells. The CAM system 5 further includes a plurality of hit circuits 60-64 coupled to each of the CAM arrays 10-14. The hit circuits 60-64 are operable to compare the data stored in the CAM cells 10-14 against data presented on the searchlines of the CAM array. Exemplary CAM cells and CAM memory devices are more fully described in U.S. Pat. Nos. 5,706,224, 5,852,569 and 5,964,857 to Srinivasan et al. and U.S. Pat. Nos. 6,101,116, 6,256,216 and 6,128,207 to Lien et al., assigned to the present assignee, the disclosures of which are herein incorporated by reference.

In order to repair a defective CAM cell, a redundant array of CAM cells 14 is provided within the CAM system 5. After testing of the CAM system 5 has been performed, defective CAM arrays that contain defective CAM cells are replaced by redundant CAM arrays of the CAM system. Testing of the CAM system may be performed by built-in self testing (GIST) as is commonly known in the art for testing memory arrays. To replace a defective array with a redundant CAM array, it is known in the art to disable the defective array and effectively shift the wordline and matchline associated with the defective array to the redundant array, thereby repairing the CAM system. In addition to shifting the defective array to the redundant array, it is also necessary to turn off the matchline of the hit circuit associated with the defective array. In accordance with the embodiment illustrated in FIG. 1, 1-to-2 decoders 40-43 are used to shift the wordlines 20-23 and 2-to-1 multiplexers 71-74 are used to shift the matchlines 30-33 when a defective array has been identified. The fuse lines 50-53 are operable to disable the wordlines 20-23 and the associated matchlines 30-33 and to shift the wordlines and matchlines to utilize the redundant wordline 24 and the redundant matchline 34 associated with the redundant CAM array 14. In this configuration, the 1-to-2 decoders are controlled by both the fuse in and fuse out of the decoder and the 2-to-1 multiplexer is controlled by the fuse out from the 1-to-2 decoder. As such, one fuse serves one group of eight rows of CAM cells and the controls for both the wordline shift and the matchline shift are switched in the same direction.

Figure 2:
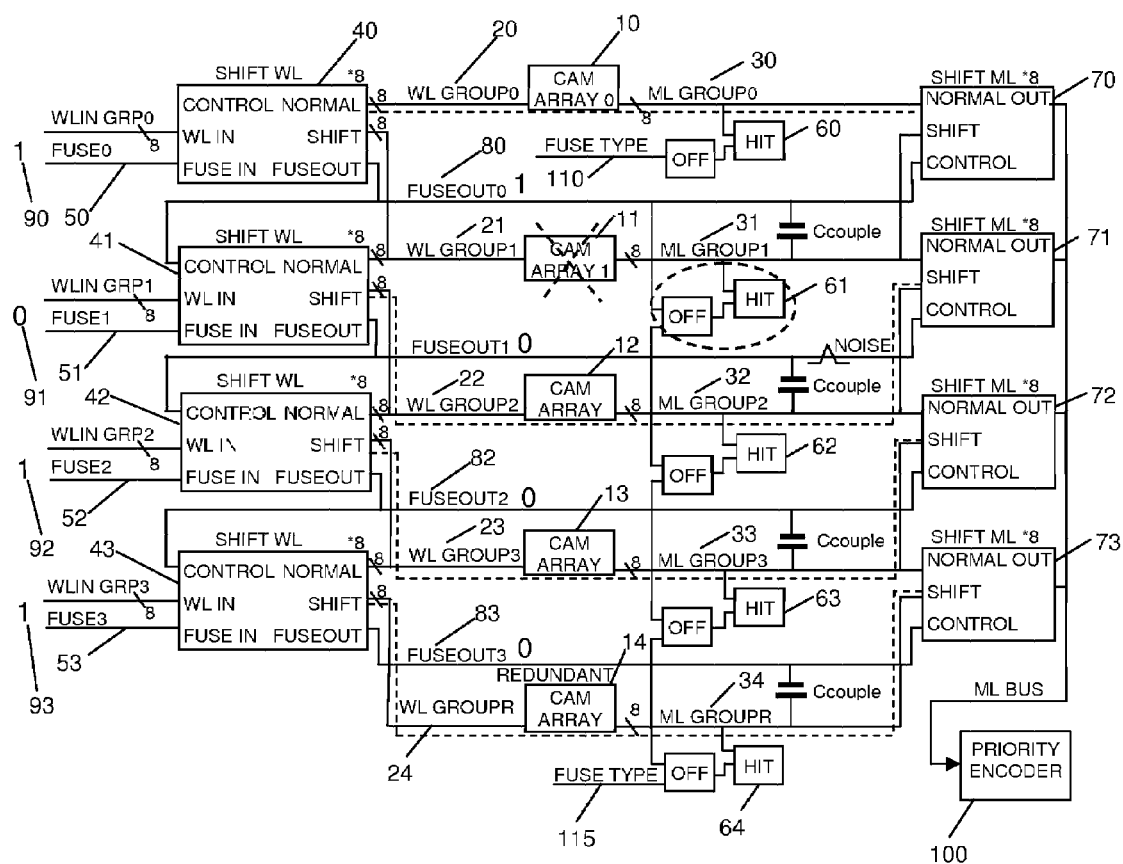
FIG. 2 is a schematic illustration of a content addressable memory array in accordance with the present invention further illustrating the logic and signal flow of the content addressable memory array when a failed row has been detected.

FIG. 2 further illustrates the signal flow and logic values which occur when a defective row is identified within a CAM array. In this exemplary embodiment, CAM array 1 11 has been identified as having a failing CAM row and as such the defective CAM array 1 11 is not useable and the signals associated with CAM array 1 11 must be rerouted to another CAM array in the CAM system 5. As such, during the testing of the CAM system 5, a fuse is programmed so that the identified failed CAM array 11 can be located and bypassed as necessary. To identify the failed CAM array 11, a fuse in communication with the fuse line identified as "fuse1" 51, which is the "fuse in" input to the 1-to-2 decoder 41, is blown and as such, the "fuse in" input 91 to the 1-to-2 decoder 41 has a logic value of zero. As such, in this particular embodiment, the "fuse in" logic values associated with the fuses 90-93 are 1011, respectively. Additionally, the "fuseout" logic values 80-83 from the decoders 40-43 are 1000, respectively, such that "fuse1"=0 identifies the failed CAM row array 11. In general, this configuration allows for one "fuseout" signal from the decoder to serve three different functions within the CAM system. In this embodiment, the "fuseout1" signal 81 is effective is shifting the wordline 21 downstream in the CAM system so that the failed CAM row array 11 will be bypassed when a read/write is requested. Additionally, the "fuseout1" signal 81 is effective in turning off the hit circuit 61 utilizing the hit off circuitry 65 so that the failed CAM row array 11 will not inadvertently assert a hit. Also, the "fuseout1" signal 81 is effective in shifting the matchline 31 downstream so that the priority encoder 100 will skip the failed matchline 31 and receive the correct matchline 32. Additionally, all the wordlines and matchlines downstream of the failed CAM row array 11 also shift accordingly, thereby utilizing the redundant CAM array 14. However, only the hit circuit 61 associated with the failed CAM row array 11 is turned off by the "fuseout1" signal 81.

Figure 3:
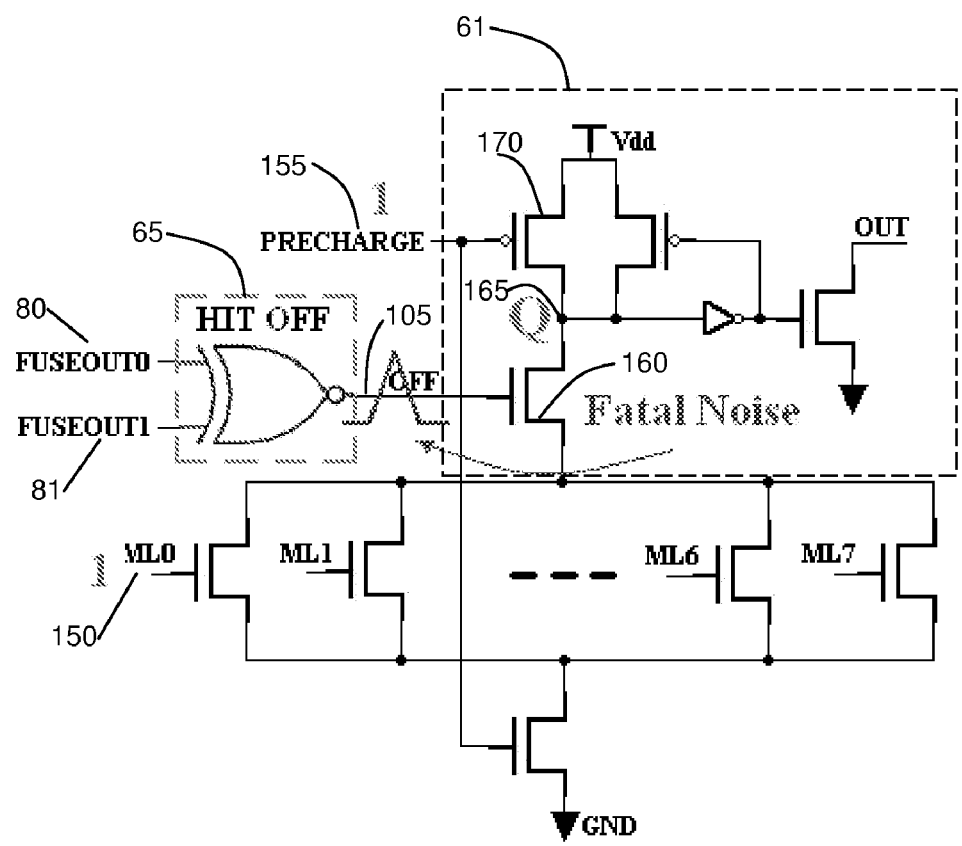
FIG. 3 is a schematic illustration of the hit off circuit and the hit circuit associated with the content addressable memory array.

FIG. 3 illustrates, in more detail, the hit and hit off circuit in accordance with an embodiment of the present invention. In this exemplary embodiment, the failed CAM row array 11 has an associated hit off circuit 65 and a hit circuit 61. In this embodiment, the hit off circuit 65 utilizes an XNOR gate to allow the "fuseout1" signal 81 to serve both the functions of shifting the associated wordlines and matchlines, and turning off the hit circuit 61. Following the logic of the XNOR gate, if the "fuseout0" signal 80 and the "fuseout1" signal 81 have different logic values, then the output 105 from the hit off circuit 65 is effective in turning off the hit circuit 61. One benefit of utilizing an XNOR gate for the hit off circuit 65 is that the "fuseout" polarity type can be selected to be either an active high or an active low. In the exemplary embodiment of FIG. 2, the "fuseout" logic values 80-83 from the decoders 40-43 were shown to be 1000. Alternatively, the "fuseout" logic values 80-83 from the decoders 40-43 could also be 0111 by simply altering the "fuse type" pin 110 located at the first CAM row array 10 and the "fuse type" pin 115 located at the redundancy CAM row array 14. Another benefit to using an XNOR gate for the hit off circuit 65 is that the two-input exclusive NOR gate allows for the logic values of the two inputs to be swapped and still maintain the same output logic. These benefits make connections between the components less complicated and allow for simplified validity checking.

Continuing with FIG. 3, coupling noise is known to occur in the hit circuit 61 due to the close proximity of and parallel placement of the matchline 150 relative to the "fuseout1" signal 81. Additionally, because the "fuseout" signal is known to be relatively long, coupling noise from other circuits is also known to occur. As previously described, when a CAM row has been identified as being defective the hit circuit 61 is disabled by the hit off circuit 65. However, noise on the "fuseout" signal can cause the hit off circuit 65 to mistakenly turn the hit circuit 61 on, causing a failure in the CAM system. In some situations, the noise on the "fuseout" signal is not fatal and the hit circuit 61 operates as expected, but in other situations, the noise causes the hit circuit 61 to assert a false hit.

In a particular embodiment, when the hit circuit 61 performs a sense operation, the precharge 155 of the hit circuit 61 is at a logic high and the matchline 150 could be at either a logic low or a logic high depending upon whether a hit or a miss has occurred from the working row CAM array 11. If coupling noise attacks the "fuseout" signal 81 and propagates through the hit off circuit 65 and presents on signal 105 as logic values 1-0-1, the "fuseout" signal 81 can temporarily turn off the N-channel transistor 160 which is expected to be in the on state. When the N-channel transistor 160 is unexpectedly turned off, the signal at Q 165 is either floating low or pulled high by the feedback P-channel transistor 170. Once the 1-0-1 noise on the "fuseout" signal 81 is gone, the signal at Q 165 can be restored. As such, a noise logic sequence of 1-0-1 is not fatal and the circuit can recover. Alternatively, if the noise on the "fuseout" signal 81 is 0-1-0, the "fuseout" signal 81 can easily turn on the N-channel transistor 160 which is expected to be in the off state. The signal at Q 165 is then pulled down to a logic value of zero and the hit circuit 61 asserts a false hit. When the logic value at Q 165 is low, the circuit cannot recover from the noise until the precharge signal 155 goes low. As such, the noise logic sequence of 0-1-0 is fatal and the hit circuit fails the hit function.

Figure 4:
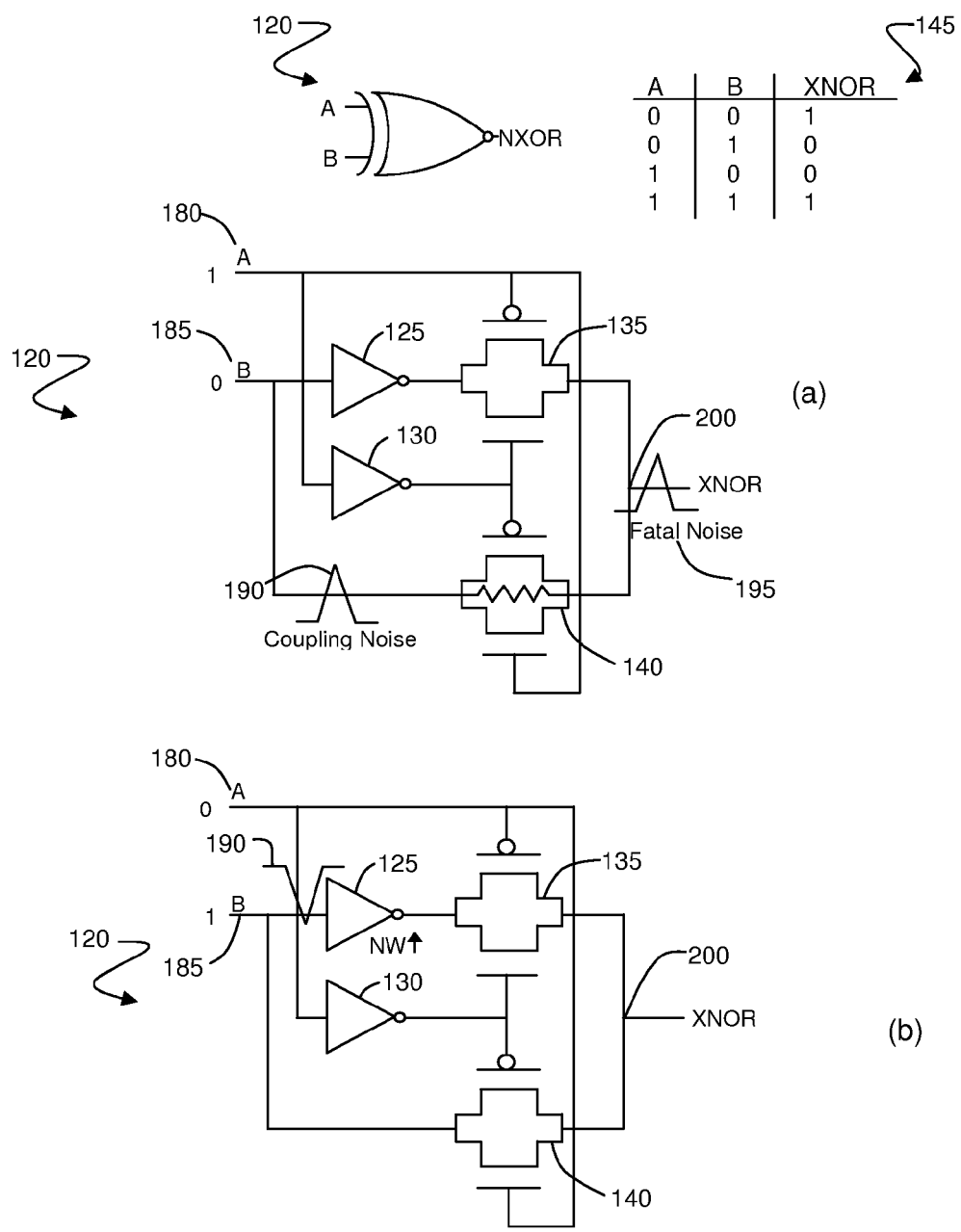
FIG. 4 is a schematic illustration of a prior hit off circuit utilizing transmission gates to realize the XNOR logic.

Referring now to FIG. 4, it is known in the art that an XNOR gate 120 utilizes transmission gates to perform the logic functions 145 of the XNOR circuit. FIG. 4 illustrates an XNOR gate 120 utilizing two inverters 125, 130 and two transmission gates 135, 140 to realize the logic values shown in the logic table 145. The output logic of this type of XNOR gate is non-inverting. With reference to FIG. 4a, in this illustrated exemplary embodiment, when input A=1 180 and input B=0 185, the turn-on transmission gate 140 of the XNOR circuit 120 is equivalent to a resistor and it allows noise 190 to be transmitted through the transmission gate 140 resulting in a fatal noise 195 at the output 200 of the XNOR circuit 120 which falsely turns on the N-channel transistor of the hit circuit 61 which causes the hit circuit 61 to be falsely triggered. Additionally, with reference to FIG. 4b, when input A=0 180 and input B=1 185, the noise 190 is isolated by the inverter 125.

Figure 5:
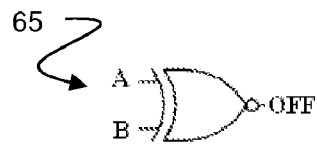
FIG. 5 is a schematic illustration of the hit off circuit in accordance with the present invention.
Figure 5:
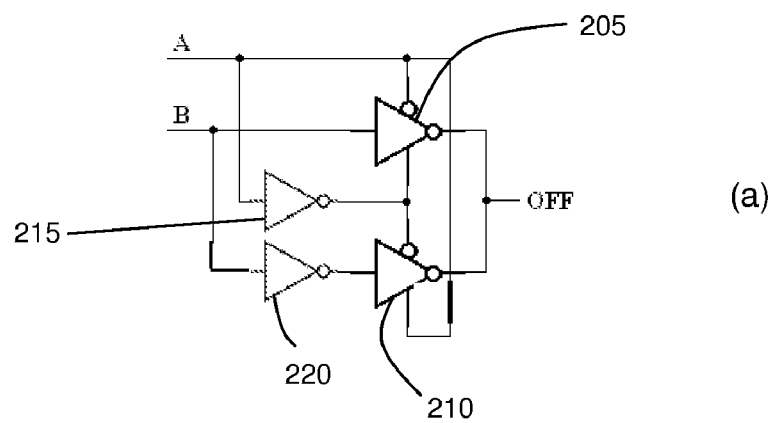
Figure 5:
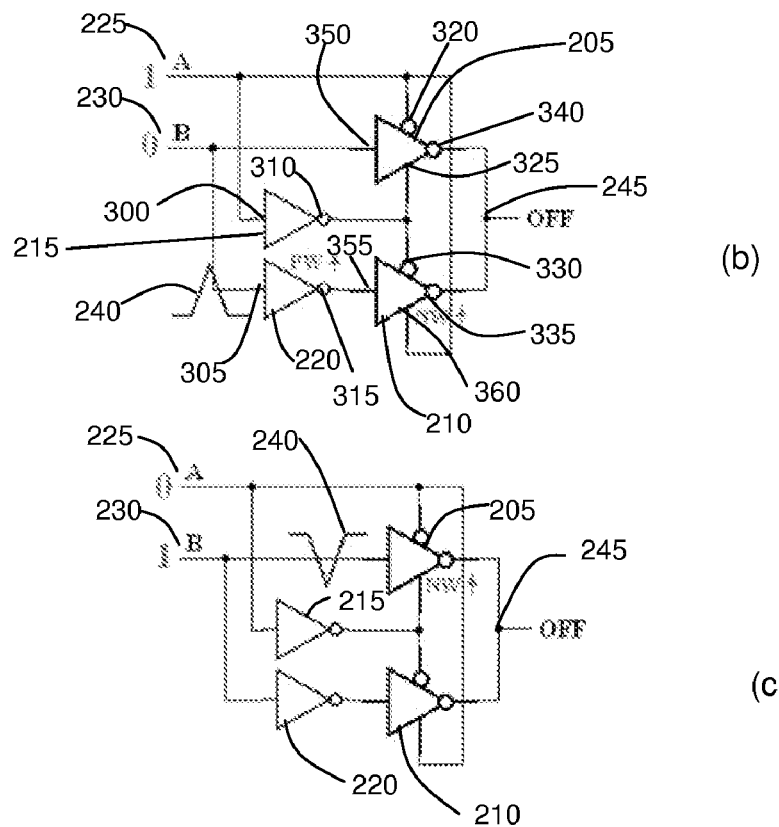

To solve the aforementioned problem regarding the use of transmission gates in the hit off circuit 65 of the CAM system which allows the hit circuit 61 to be falsely triggered in the presence of noise, the hit off circuit 65 of the present invention utilizes tristate inverters. As shown with reference to FIG. 5a, the hit off circuit 65 in accordance with the present invention includes two tristate inverters 205, 210 and two inverters 215, 220 to realize the logic values for the XNOR gate of the hit off circuit 65. With reference to FIG. 5b, in accordance with a particular embodiment of the present invention, when input A=1 225 and input B=0 230, the noise 240 is isolated by the inverter 220 and the tristate inverter 210 and does not effect the output 245 to the hit circuit 61. In addition, with reference to FIG. 5c, when the input A=0 225 and input B=1 230, the noise 240 must exceed the noise margin of the tristate inverter 205 to switch the tristate inverter first before it can turn on the N-channel transistor of the hit circuit 61. Since the noise 240 does not exceed the noise margin of the tri-state inverter 205, the tri-state inverter 205 is effective in isolating the noise 240 and preventing the hit circuit 61 from falsely triggering. As such, the present invention is effective in preventing noise on a matchline from reaching the hit circuit.

As shown in FIG. 5b, the XNOR circuit 65 in accordance with the present invention includes a first input signal 225 and a second input signal 230, a first inverter 215, a second inverter 220, a first tristate inverter 205 and a second tristate inverter 210. In a particular embodiment, the first input signal 225 is coupled to the input 300 of the first inverter 215 and the second input signal 230 is coupled to the 305 input of the second inverter 220. The first tristate inverter 205 has an input 305 coupled to the second input signal 230, an enable bar input 320 coupled to the first input signal 225 and an enable input 325 coupled to the output 310 of the first inverter 215. The second tristate inverter 210 has an input 355 coupled to the output 315 of the second inverter 220, an enable bar input 330 coupled to the enable input 325 of the first tristate inverter and the output 310 of the first inverter, an enable input 360 coupled to the enable bar input 320 of the first tristate inverter 205 and the first input signal 225, and an output 335 coupled to the output 340 of the first tristate inverter 205.

Figure 6:
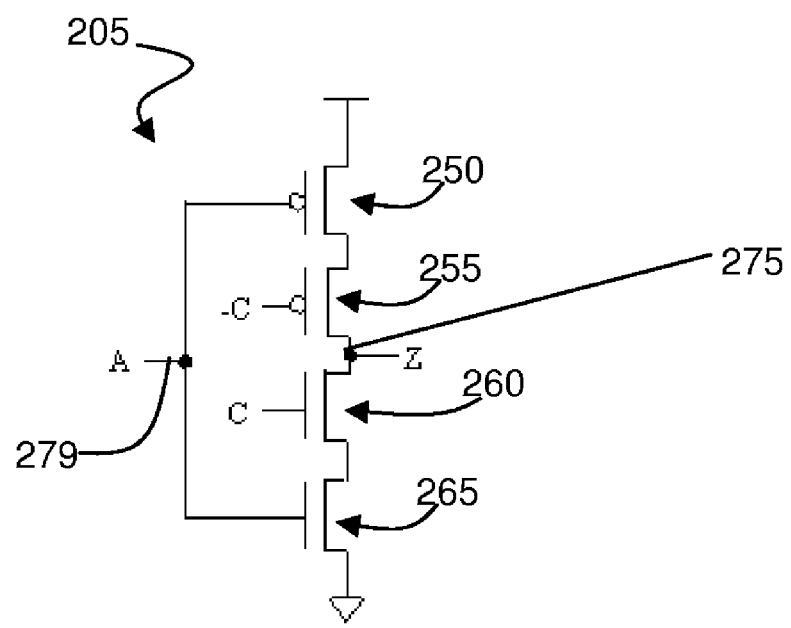
FIG. 6 is a schematic illustration of the tristate inverter of the hit off circuit in accordance with the present invention.

With reference to FIG. 6, the tristate inverter 205 of the present invention is illustrated in more detail. As illustrated, the tristate inverter 205 in accordance with the present invention includes a first PMOS device 250 having a source node coupled to a power supply voltage and a gate node coupled to a "fuseout" signal 279, a second PMOS device 255 having a source node coupled to a drain node of the first PMOS device 250 and a gate node coupled to a ground supply voltage, a first NMOS device 260 having a drain node coupled to the output 275 and a gate node coupled to the power supply voltage, a second NMOS device 265 having a drain coupled to a source node of the first NMOS device 260, a gate node coupled to the "fuseout" signal 279 and a source node coupled to a ground supply voltage, wherein the output is coupled to the hit circuit 61. Noise at the "fuseout" signal must exceed the tristate inverter's 205 high input voltage level (Vih) to turn on the tristate inverter. If the ratio of the driving strength of the NMOS transistor 265 of the tristate inverter 205 and the driving strength of the PMOS transistor 250 of the tristate inverter 205 is equal to 1, then the high input voltage level (Vih) of the tristate inverter 205 is more than 50% of Vdd and the tristate inverter 205 is capable of blocking a 50% coupling noise on the "fuseout" signal line 279. Additionally, the tristate inverter's high input voltage level (Vih) can be increased by layout tristate inverter's PMOS stronger than NMOS. Additionally, because the output logic of a transmission gate is non-inverted, but the tri-state inverter output is inverted, the tri-state inverter input connections can be changed without adding an additional inverter to tristate, and as such, the logic of the XNOR gate utilizing transmission gates is equivalent to the logic of the XNOR gate utilizing tri-state inverters.

As such, the incorporation of a tristate inverter into the hit off circuit of the CAM system, in accordance with the present invention, reduces the capacitive coupling noise that is coupled to the hit circuit. The tristate inverter is effective in disabling the hit circuit and preventing noise from reaching the hit circuit.

Although specific embodiments of the invention have been disclosed, it will be understood by those having ordinary skill in the art that changes can be made to the specific embodiments without departing from the spirit and scope of the invention. Additionally, many modifications may be made to adapt a particular situation to the teachings of the present invention without departing from the central inventive concepts described herein. Furthermore, an embodiment of the present invention may not include all of the features described above. The scope of the invention is not to be restricted, therefore, to the specific embodiments, and it is intended that the appended claims cover any and all such applications, modifications, and embodiments within the scope of the present invention.

What is claimed is:

1. A content addressable memory (CAM) system, the system comprising:
    a plurality of CAM arrays having a plurality of rows of CAM cells to store data coupled to wordlines, searchlines, bitlines and matchlines for reading from, writing to, and searching data in the CAM cells;
    a hit circuit coupled to the matchlines of each of the plurality of CAM arrays, the hit circuit to compare the data stored in the CAM cells against data presented on the wordlines of the CAM array;
    a fuse circuit to identify a CAM array as being a defective CAM array or a non-defective CAM array;
    a shift circuit coupled to the each of the plurality of CAM arrays, the shift circuit to shift the wordlines and the matchlines to bypass an identified defective CAM array; and
    a hit off circuit coupled to the hit circuit, the hit off circuit to turn off the hit circuit for an identified defective CAM array, the hit off circuit further comprising an XNOR circuit utilizing tristate inverters to reduce capacitive coupling noise at the output of the XNOR circuit.

2. The CAM system of claim 1, wherein the shift circuit further comprises:
    at least one redundant CAM array;

a wordline shift circuit coupled between the fuse circuit and each of the plurality of CAM arrays and to the at least one redundant CAM array, the wordline shift circuit to shift the wordlines of a defective CAM array to a non-defective CAM array or to the at least one redundant CAM array; and a matchline shift circuit coupled to each of the plurality of CAM arrays, to the at least one redundant CAM array and to the wordline shift circuit, the matchline shift circuit to shift the matchlines of a defective CAM array to a non-defective CAM array or to the at least one redundant CAM array.

3. The CAM system of claim 2, wherein the wordline shift circuit further comprises a fuseout output signal that controls the shifting of the wordlines, matchlines and the hit off circuit.

4. The CAM system of claim 2, wherein the wordline shift circuit further comprises a 1-to-2 decoder coupled between the fuse circuit and each of the plurality of CAM arrays.

5. The CAM system of claim 2, wherein the matchline shift circuit further comprises a 2-to-1 multiplexer coupled to each of the plurality of CAM arrays.

6. The CAM system of claim 1, wherein each of the plurality of CAM arrays further comprises a plurality of rows of CAM cells.

7. The CAM system of claim 1, wherein the hit off circuit further comprises a fuse type pin, the fuse type pin to identify the XNOR circuit as having either high polarity or low polarity.

8. The CAM system of claim 1, wherein the tristate inverter further comprises an input, an output and an enable input, and wherein the output of the tristate inverter is equal to the input of the tristate inverter when the enable input is at a high logic state and the output of the tristate inverter is at a high impedance state when the enable input is at a low logic state.

9. The CAM system of claim 1, wherein the XNOR circuit further comprises:

a first input signal and a second input signal;

a first inverter having an input and an output, wherein the input of the first inverter is coupled to the first input signal;

a second inverter having an input and an output, wherein the input of the second inverter is coupled to the second input signal;

a first tristate inverter having an input, an output, an enable input and an enable bar input, wherein the first input signal is coupled to the enable bar input of the first tristate inverter, the second input signal is coupled to the input of the first tristate inverter and the output of the first inverter is coupled to the enable input of the first tristate inverter;

a second tristate inverter having an input, an output, an enable input and an enable bar input, wherein the output of the second inverter is coupled to the input of the second tristate inverter, the output of the first tristate inverter is coupled to the enable bar input of the second tristate inverter, the enable input of the second tristate inverter is coupled to the enable bar input of the first tristate inverter and the output of the second tristate inverter is coupled to the enable bar input of the first tristate inverter; and the output of the first tristate inverter is coupled to the output of the second tristate inverter.

10. The CAM system of claim 1, wherein the tristate inverter further comprises:

a first PMOS device having a source node coupled to a power supply voltage and a gate node coupled to the matchline;

a second PMOS device having a source node coupled to a drain node of the first PMOS device and a gate node coupled to a ground supply voltage;

an inverter having an input coupled to a drain node of the second PMOS device and an output coupled to the hit circuit;

a first NMOS device having a drain node coupled to the input of the inverter and a gate node coupled to the power supply voltage; and a second NMOS device having a drain coupled to a source node of the first NMOS device, a gate node coupled to the matchline and a source node coupled to a ground supply voltage.

11. A method for reducing coupling noise on a matchline of a content addressable memory (CAM) system having a plurality of CAM arrays and having at least one redundant CAM array, and at least one hit circuit coupled to wordlines, searchlines, bitlines and matchlines, the method comprising:

identifying at least one defective CAM array in the CAM system;

enabling fuse circuitry to disable the CAM array identified as being defective;

shifting the wordlines and matchlines of the defective CAM array to a non-defective CAM array, thereby bypassing the defective CAM array and utilizing the at least one redundant CAM array; and disabling the hit circuit of the defective CAM array utilizing an XNOR circuit comprising at least one tristate inverter to reduce the coupling noise on the matchline of the defective CAM array.

12. The method of claim 11, wherein the CAM array is disabled upon the identification of a defective CAM cell in anyone of the rows of CAM cells within the CAM array.

13. The method of claim 11, wherein each of the plurality of CAM arrays further comprises a plurality of rows of CAM cells.

14. The method of claim 11, wherein the hit off circuit further comprises a fuse type pin, the fuse type pin to identify the XNOR circuit as having either high polarity or low polarity.

15. The method of claim 11, wherein the tristate inverter further comprises an input, an output and an enable input, and wherein the output is equal to the input when the enable input is at a high logic state and the output is at a high impedance state when the enable input is at a low logic state.

16. The method of claim 11, wherein the XNOR circuit further comprises:

a first input signal and a second input signal;

a first inverter having an input and an output, wherein the input of the first inverter is coupled to the first input signal;

a second inverter having an input and an output, wherein the input of the second inverter is coupled to the second input signal;

a first tristate inverter having an input, an output, an enable input and an enable bar input, wherein the first input signal is coupled to the enable bar input of the first tristate inverter, the second input signal is coupled to the input of the first tristate inverter and the output of the first inverter is coupled to the enable input of the first tristate inverter;

a second tristate inverter having an input, an output, an enable input and an enable bar input, wherein the output of the second inverter is coupled to the input of the second tristate inverter, the output of the first tristate inverter is coupled to the enable bar input of the second tristate inverter, the enable input of the second tristate inverter is coupled to the enable bar input of the first tristate inverter and the output of the second tristate inverter is coupled to the enable bar input of the first tristate inverter; and the output of the first tristate inverter is coupled to the output of the second tristate inverter.

17. The method of claim 11, wherein the tristate inverter further comprises:

a first PMOS device having a source node coupled to a power supply voltage and a gate node coupled to the matchline;

a second PMOS device having a source node coupled to a drain node of the first PMOS device and a gate node coupled to a ground supply voltage;

an inverter having an input coupled to a drain node of the second PMOS device and an output coupled to the hit circuit;

a first NMOS device having a drain node coupled to the input of the inverter and a gate node coupled to the power supply voltage; and a second NMOS device having a drain coupled to a source node of the first NMOS device, a gate node coupled to the matchline and a source node coupled to a ground supply voltage.

18. A content addressable memory (CAM) system, the system comprising:

a plurality of CAM arrays having a plurality of rows of CAM cells to store data coupled to wordlines, searchlines, bitlines and matchlines for reading from, writing to, and searching data in the CAM cells;

a hit circuit coupled to the matchlines of each of the plurality of CAM arrays, the hit circuit to compare the data stored in the CAM cells against data presented on the wordlines of the CAM array;

a fuse circuit to identify a CAM array as being a defective CAM array or a non-defective CAM array;

at least one redundant CAM array;

a wordline shift circuit coupled between the fuse circuit and each of the plurality of CAM arrays and to the at least one redundant CAM array, the wordline shift circuit to shift the wordlines of a defective CAM array to a non-defective CAM array or to the at least one redundant CAM array;

a matchline shift circuit coupled to each of the plurality of CAM arrays, to the at least one redundant CAM array and to the wordline shift circuit, the matchline shift circuit to shift the matchlines of a defective CAM array to a non-defective CAM array or to the at least one redundant CAM array; and a hit off circuit coupled to the hit circuit, the hit off circuit to turn off the hit circuit for an identified defective CAM array, the hit off circuit further comprising an XNOR circuit utilizing tristate inverters to reduce capacitive coupling noise at the output of the XNOR circuit.

19. The CAM system of claim 18, wherein the XNOR circuit further comprises:

a first input signal and a second input signal;

a first inverter having an input and an output, wherein the input of the first inverter is coupled to the first input signal;

a second inverter having an input and an output, wherein the input of the second inverter is coupled to the second input signal;

a first tristate inverter having an input, an output, an enable input and an enable bar input, wherein the first input signal is coupled to the enable bar input of the first tristate inverter, the second input signal is coupled to the input of the first tristate inverter and the output of the first inverter is coupled to the enable input of the first tristate inverter;

a second tristate inverter having an input, an output, an enable input and an enable bar input, wherein the output of the second inverter is coupled to the input of the second tristate inverter, the output of the first tristate inverter is coupled to the enable bar input of the second tristate inverter, the enable input of the second tristate inverter is coupled to the enable bar input of the first tristate inverter and the output of the second tristate inverter is coupled to the enable bar input of the first tristate inverter; and the output of the first tristate inverter is coupled to the output of the second tristate inverter.

20. The CAM system of claim 18, wherein the tristate inverter further comprises:

a first PMOS device having a source node coupled to a power supply voltage and a gate node coupled to the matchline;

a second PMOS device having a source node coupled to a drain node of the first PMOS device and a gate node coupled to a ground supply voltage;

an inverter having an input coupled to a drain node of the second PMOS device and an output coupled to the hit circuit;

a first NMOS device having a drain node coupled to the input of the inverter and a gate node coupled to the power supply voltage; and a second NMOS device having a drain coupled to a source node of the first NMOS device, a gate node coupled to the matchline and a source node coupled to a ground supply voltage.

* * * * *